US010693028B2

United States Patent
Karam et al.

(10) Patent No.: US 10,693,028 B2
(45) Date of Patent: Jun. 23, 2020

(54) MICRO-CONCENTRATOR SOLAR ARRAY USING MICRO-ELECTROMECHANICAL SYSTEMS (MEMS) BASED REFLECTORS

(71) Applicant: The Boeing Company, Chicago, IL (US)

(72) Inventors: Nasser H. Karam, LaCanada, CA (US); Dimitri D. Krut, Encino, CA (US); Scott B. Singer, Sherman Oaks, CA (US)

(73) Assignee: The Boeing Company, Chicago, IL (US)

( * ) Notice: Subject to any disclaimer, the term of this patent is extended or adjusted under 35 U.S.C. 154(b) by 229 days.

(21) Appl. No.: 14/186,703

(22) Filed: Feb. 21, 2014

(65) Prior Publication Data

US 2015/0243819 A1    Aug. 27, 2015

(51) Int. Cl.
*H01L 31/054*    (2014.01)
*H02S 20/32*    (2014.01)
*H01L 31/0525*    (2014.01)

(52) U.S. Cl.
CPC ...... *H01L 31/0525* (2013.01); *H01L 31/0547* (2014.12); *H02S 20/32* (2014.12); *Y02E 10/52* (2013.01)

(58) Field of Classification Search
CPC ............ G02B 26/0833; G02B 26/0841; G02B 26/085; H01L 31/054; H01L 31/0547; H02S 20/32
USPC ................................... 359/291; 136/243–265
See application file for complete search history.

(56) References Cited

U.S. PATENT DOCUMENTS

| | | |
|---|---|---|
| 412,724 A | 10/1889 | Calver |
| 503,004 A | 8/1893 | Severy |
| 629,122 A | 7/1899 | Davis |
| 811,274 A | 1/1906 | Carter |
| 2,846,724 A | 8/1958 | Aylwin |
| 2,987,961 A | 6/1961 | Cotton et al. |
| 3,466,119 A | 9/1969 | Francia |
| 3,713,727 A | 1/1973 | Markosian et al. |
| 3,861,379 A | 1/1975 | Anderson, Jr. |
| 3,905,352 A | 9/1975 | Jahn |
| 3,964,464 A | 6/1976 | Hockman |
| 4,034,737 A | 7/1977 | Kume |
| 4,038,971 A | 8/1977 | Bezborodko |
| 4,044,753 A | 8/1977 | Fletcher et al. |

(Continued)

FOREIGN PATENT DOCUMENTS

| | | |
|---|---|---|
| DE | 29615560 | 2/1997 |
| DE | 102009037083 | 2/2011 |

(Continued)

OTHER PUBLICATIONS

U.S. Appl. No. 12/416,207; Non-Final Office Action (dated Jun. 18, 2015).

(Continued)

*Primary Examiner* — Eli S Mekhlin
*Assistant Examiner* — Dujuan A Horton

(57) ABSTRACT

A micro-concentrator solar array is provided, and includes a plurality of solar cells and a plurality of micro-electromechanical systems (MEMS) based reflectors. Each solar cell includes a focal point. The MEMS based reflectors are each selectively tiltable about at least one axis to reflect a beam of light onto the focal point of one of the solar cells.

20 Claims, 4 Drawing Sheets

(56) References Cited

U.S. PATENT DOCUMENTS

| | | |
|---|---|---|
| 4,046,411 A | 9/1977 | Richard, Jr. |
| 4,106,480 A | 8/1978 | Lyon et al. |
| 4,110,010 A | 8/1978 | Hilton |
| 4,198,826 A | 4/1980 | Chromie |
| 4,235,224 A | 11/1980 | Yarwood et al. |
| 4,243,019 A | 1/1981 | Severson |
| 4,249,514 A | 2/1981 | Jones |
| 4,262,660 A | 4/1981 | Ilich |
| 4,263,895 A | 4/1981 | Colao |
| 4,318,393 A | 3/1982 | Goldstein |
| 4,343,294 A | 8/1982 | Daniel |
| 4,405,010 A | 9/1983 | Schwartz |
| 4,463,749 A | 8/1984 | Sobczak et al. |
| 4,532,916 A | 8/1985 | Aharon |
| 4,599,995 A | 7/1986 | Dane |
| 4,784,700 A | 11/1988 | Stern et al. |
| 4,825,062 A | 4/1989 | Rather et al. |
| 5,071,243 A | 12/1991 | Bronstein |
| 5,109,349 A | 4/1992 | Ulich et al. |
| 5,269,288 A | 12/1993 | Stirbl et al. |
| 5,325,844 A | 7/1994 | Rogers et al. |
| 5,862,799 A | 1/1999 | Yogev et al. |
| 5,979,438 A | 11/1999 | Nakamura |
| 6,028,689 A | 2/2000 | Michalicek et al. |
| 6,091,050 A | 7/2000 | Carr |
| 6,225,551 B1 | 5/2001 | Lewandowski et al. |
| 6,231,197 B1 | 5/2001 | Nakamura |
| 6,542,657 B2 | 4/2003 | Anderson |
| 6,906,848 B2 | 6/2005 | Aubuchon |
| 6,942,747 B1 | 9/2005 | Wapner et al. |
| 6,984,050 B2 | 1/2006 | Nakamura |
| 7,133,193 B2 | 11/2006 | Cornwell et al. |
| 7,567,218 B2 | 7/2009 | Whelan |
| 7,677,241 B2 | 3/2010 | Hickerson |
| 7,777,959 B2 | 8/2010 | Sohn et al. |
| 7,866,836 B2 | 1/2011 | Rabinowitz |
| 7,905,227 B2 | 3/2011 | Luconi et al. |
| 8,008,887 B2 | 8/2011 | Lee |
| 8,071,873 B2 | 12/2011 | Rabinowitz |
| 8,472,105 B2 | 6/2013 | Zhou |
| 2005/0034751 A1* | 2/2005 | Gross ............... H01L 31/0547 |
| | | 136/246 |
| 2005/0157411 A1 | 7/2005 | Rabinowitz |
| 2005/0229924 A1 | 10/2005 | Luconi et al. |
| 2006/0038103 A1 | 2/2006 | Helmbrecht |
| 2006/0109539 A1* | 5/2006 | Katoh ............... G02B 26/0841 |
| | | 359/291 |
| 2006/0201498 A1 | 9/2006 | Olsson et al. |
| 2007/0107769 A1* | 5/2007 | Cobb ............... H01L 31/0547 |
| | | 136/246 |
| 2007/0146741 A1 | 6/2007 | Hillmer et al. |
| 2007/0236773 A1 | 10/2007 | Pan |
| 2008/0018975 A1 | 1/2008 | Moidu |
| 2008/0137172 A1 | 6/2008 | Staker et al. |
| 2009/0188545 A1 | 7/2009 | Rabinowitz |
| 2010/0192941 A1 | 8/2010 | Stoia et al. |
| 2010/0236603 A1* | 9/2010 | Menard ............... G02B 3/0056 |
| | | 136/246 |
| 2010/0326521 A1* | 12/2010 | Rabinowitz ............ G02B 7/183 |
| | | 136/259 |
| 2011/0101253 A1 | 5/2011 | Lal et al. |
| 2012/0031465 A1* | 2/2012 | Battistutti ............ H01L 31/048 |
| | | 136/246 |
| 2013/0134921 A1 | 5/2013 | Shen et al. |

FOREIGN PATENT DOCUMENTS

| | | |
|---|---|---|
| JP | 2005217171 A | 8/2005 |
| JP | 2006113437 A | 4/2006 |
| JP | 2010139991 A | 6/2010 |
| JP | 2012028658 A | 2/2012 |
| WO | 2008/050354 | 5/2008 |
| WO | 2009/126263 | 10/2009 |
| WO | 2010/065794 | 6/2010 |
| WO | 2010065794 A2 | 6/2010 |
| WO | 2010065794 A3 | 8/2012 |

OTHER PUBLICATIONS

U.S. Appl. No. 12/416,207, Final Office Action (dated Jan. 28, 2015).
Webpage featuring product information for "DLP® Projectors," by Texas Instruments, http://www.dlp.com/projectors/filters_free.aspx (retrieved from the internet Apr. 2, 2009).
U.S. Appl. No. 12/416,207, Office Action dated Oct. 21, 2011.
U.S. Appl. No. 12/416,207, Office Action dated May 15, 2013.
U.S. Appl. No. 12/416,207, Advisory Action dated Dec. 20, 2013.
U.S. Appl. No. 12/416,207, Office Action dated Jan. 17, 2014.
U.S. Appl. No. 12/416,207, Office Action dated Aug. 27, 2014.
EP, European Search Report and Opinion; Patent Application No. 15150912.2 (dated Jun. 29, 2015).
Hah, D. et al., "Low-Voltage, Large-Scan Angle MEMS Analog Micromirror Arrays With Hidden Vertical Comb-Drive Actuators," Journal of Microelectromechanical Systems, vol. 13, No. 2, pp. 279-289 (Apr. 2004).
Legtenberg, R. et al., "Comb-drive actuators for large displacements," J. Micromech. Microeng., 6, pp. 320-329 (1996).
"Mirrorcle Technologies MEMS Mirrors—Technical Overview," by Mirrorcle Technologies, Inc., 6 pages (2009).
V Viereck et at, "Sun Glasses for Buildings based on Micro Mirror Arrays: Technology, Control by Networked Sensors and Scaling Potential", 2008 5th International Conference on Networked Sensing Systems [online], 2008 (searched on Nov. 6, 2018).
Decision of Rejection, Received from the Japanese Patent Office, dated Jun. 10, 2019.

* cited by examiner

MICRO-CONCENTRATOR SOLAR ARRAY USING MICRO-ELECTROMECHANICAL SYSTEMS (MEMS) BASED REFLECTORS

FIELD

The disclosed system and method relate to a micro-concentrator solar array and, more particularly, to a micro-concentrator solar array using micro-electromechanical systems (MEMS) based reflectors to track light onto a solar cell.

BACKGROUND

Electric power generation from solar or photovoltaic cells has experienced significant interest recently. Solar cells convert light energy, typically from the sun, into electrical energy. The light intensity on a solar cell may be referred to as the number of suns, where a 1-sun concentration corresponds to standard illumination at 1 kW/m$^2$.

Widespread adoption of solar cells for power generation may require further breakthrough in both the cost and efficiency. For example, many solar power generators currently available employ flat-plate technologies, where the solar cells operate under 1-sun concentration. These types of solar power generators have relatively low solar-to-power conversion efficiencies, are relatively large and cumbersome, and tend to transform a majority of light energy into heat. Moreover, these solar power generators may result in relatively long charge times in practice. Specifically, sometimes charging equipment using the solar power generator may take many hours, even over several days. In addition to the long charge times, the position of the solar power generators need to be adjusted periodically during the day in order to accommodate the changing position of the sun in the sky.

SUMMARY

In one aspect, a micro-concentrator solar array is provided, and includes a plurality of solar cells and a plurality of micro-electromechanical systems (MEMS) based reflectors. Each solar cell includes a focal point. The MEMS based reflectors are each selectively tiltable about at least one axis to reflect a beam of light onto the focal point of one of the solar cells.

In another aspect, a micro-concentrator solar array is provided, and includes a plurality of solar cells, a plurality of MEMS based reflectors, and a control module. Each solar cell includes a focal point. The MEMS based reflectors are each selectively tiltable about at least one axis to reflect a beam of light onto the focal point of one of the solar cells. The control module may be in operative communication with the solar cells and the MEMS based reflectors. The control module includes control logic for monitoring an electrical output generated by the solar cells. The control module also includes control logic for determining if the electrical output generated by the solar cells is below a threshold value. The control module also includes control logic for re-positioning the MEMS based reflectors about the at least one axis if the electrical output generated by the solar cells is below the threshold value.

In yet another aspect, a method of tracking a beam of light onto a focal point of a solar cell is disclosed. The solar cell may be part of a micro-concentrator solar array. The method includes monitoring an electrical output generated by a plurality of solar cells by a control module. The method also includes determining if the electrical output generated by the solar cells is below a threshold value by the control module. The method also includes re-positioning a plurality of MEMS based reflectors about at least one axis if the electrical output generated by the solar cells is below the threshold value by the control module. The MEMS based reflectors are each selectively tiltable about the at least one axis to reflect the beam of light onto the focal point of one of the solar cells.

Other objects and advantages of the disclosed method and system will be apparent from the following description, the accompanying drawings and the appended claims.

DETAILED DESCRIPTION

Figure 1:
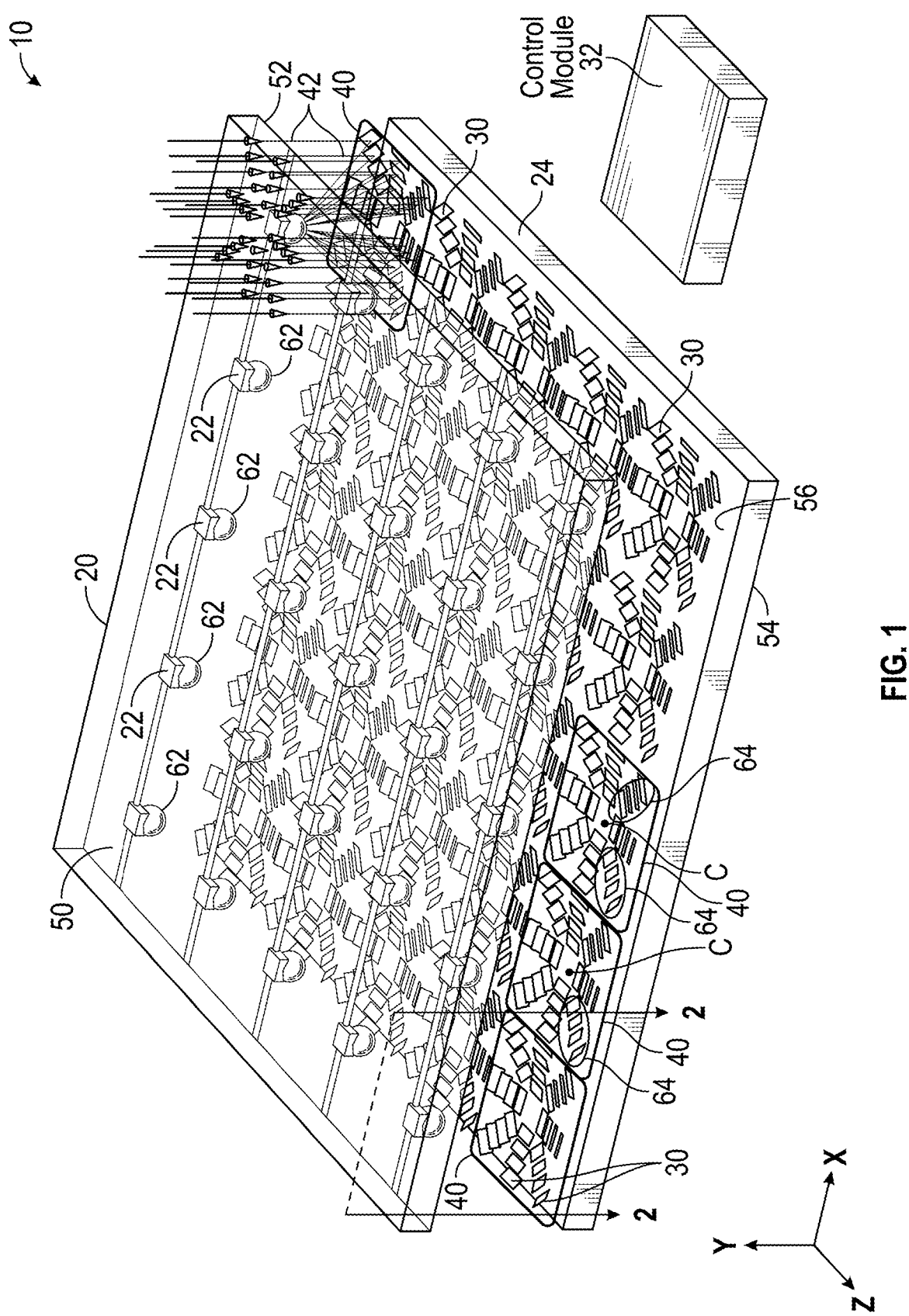
FIG. 1 is an illustration of the disclosed micro-concentrator solar array including a plurality of solar cells arranged on a coverglass and a plurality of micro-electromechanical systems (MEMS) based reflectors arranged on a substrate.

As shown in FIG. 1, the micro-concentrator solar array 10 according to an aspect of the disclosure may include a coverglass 20, a plurality of solar cells 22, a substrate 24, a plurality of micro-electromechanical systems (MEMS) based mirrors or reflectors 30, and a control module 32. In the exemplary aspect as shown, the solar cells 22 may be arranged in a 5×5 array upon the coverglass 20, which results in a total of twenty-five solar cells 22 included within the micro-concentrator solar array 10. However, those skilled in the art will appreciate that the solar array 10 may include any number of solar cells 22. An array 40 of reflectors 30 may be associated with each solar cell 22. Each reflector 30 included within the array 40 may be positioned relative to the associated solar cell 22 in order to focus or reflect a plurality of light beams 42 generated by a light source (not illustrated) onto the solar cell 22.

The light source may be any type of radiating energy source such as, for example, man-made lighting in a building, or the sun. Each reflector 30 may be selectively tiltable such that if the position of the light source changes, each reflector 30 located within the associated array 40 may be tilted accordingly in order to track the changed position of the light source relative to the associated solar cell 22. For example, if the light source is the sun, then each reflector 30 located within the associated array 40 may be tilted accordingly in order to track the changing position of the sun throughout the day. The tilting of the reflectors 30 relative to the light source is described in greater detailed below.

The micro-concentrator solar array 10 may be used in any application where light energy, typically from the sun, may be converted into electrical energy. For example, FIG. 1 illustrates a single micro-concentrator solar array 10 for purposes of convenience and clarity. The single micro-concentrator solar array 10 in FIG. 1 may be used in relatively compact applications such as, for example, a slim-line pocket-sized portable power generator. However, the single micro-concentrator solar array 10 may be electrically connected or ganged with other micro-concentrator solar arrays in order to create a two-dimensional or tiled array of multiple micro-concentrator arrays (not illustrated). The two-dimensional array of multiple micro-concentrator arrays may be used in relatively large-scale applications such as, for example, a terrestrial portable power generator, an unmanned aerial vehicle (UAV), or a satellite.

The coverglass 20 may be constructed of any transparent material that allows for the light beams 42 to pass through such as, for example, glass, plastic, or silicon dioxide. The substrate 24 may be used to support or mount the reflectors 30. In one non-limiting aspect, the substrate 24 may be constructed of fused silica.

Figure 2:
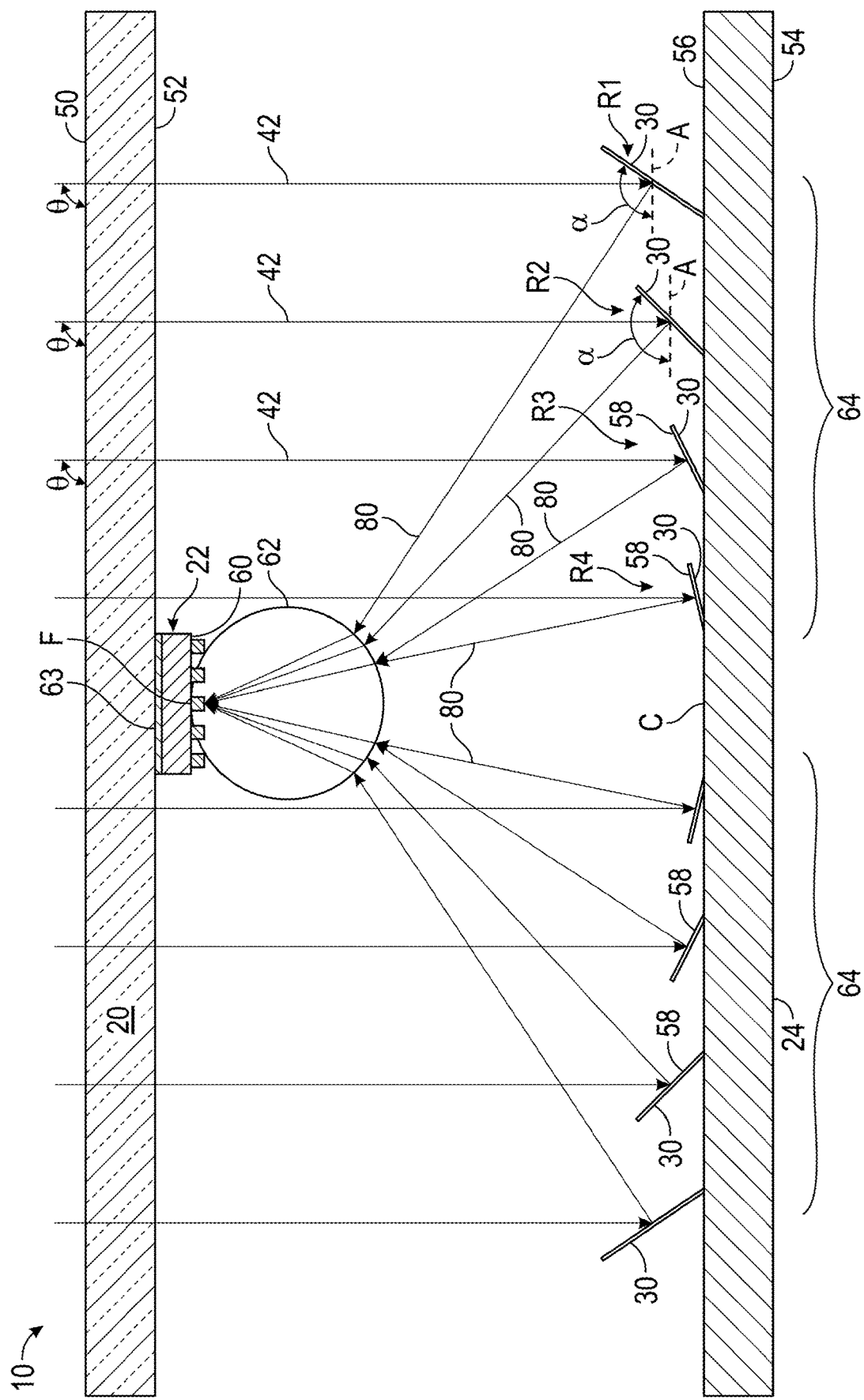
FIG. 2 is a cross-section of the micro-concentrator solar array taken along section line A-A in FIG. 1.

FIG. 2 is a cross-section of a portion of the coverglass 20, a single solar cell 22, the substrate 24, and the reflectors 30 associated with the single solar cell 22, taken along section line A-A in FIG. 1. Referring generally to FIGS. 1-2, the coverglass 20 may include an outer surface 50 and an inner surface 52, and the substrate 24 may also include an outer surface 54 and an inner surface 56. In one aspect, an optional anti-reflection coating may be applied to the inner and outer surfaces 52, 50, of the coverglass 20. The inner surface 52 of the coverglass 20 generally opposes the inner surface 56 of the substrate 24. Each solar cell 22 may include a front surface 60 and a back surface 63 (seen in FIG. 2). The back surface 63 of the solar cell 22 may be affixed to or carried by the inner surface 52 of the coverglass 20.

Although FIGS. 1-2 show the coverglass 20 located above the substrate 24, it is to be understood that this illustration is merely exemplary in nature. Those skilled in the art will appreciate that the coverglass 20 may be located relative to the substrate 24 in any position where the light beams 42 may be directed upon the reflectors 30 and onto the solar cells 22. For example, in another aspect, the micro-concentrator solar array 10 may be rotated by ninety degrees, and the coverglass 20 may be located to the right of the substrate 24. Moreover, in some aspects the coverglass 20 may be omitted. Instead, the solar cells 22 may be mounted on a corresponding support member 320 shown in FIG. 5, and is described in greater detail below.

Referring to FIG. 1, in one aspect the reflectors 30 may be arranged in a two-dimensional pattern upon the inner surface 56 of the substrate 24. Specifically, each array 40 may include multiple sub-arrays 64 of reflectors 30. In the aspect as shown in FIG. 1, each sub-array 64 may include four reflectors 30, however it is to be understood that any number of reflectors 30 may be included within the sub-array 64 as well. In the non-limiting aspect as shown in FIG. 1, each sub-array 64 of reflectors 30 may be arranged in a radially outward direction with respect to a central point C of the array 40. The specific solar cell 22 associated with the array 40 may be positioned along the inner surface 52 of the coverglass 20 to generally oppose the central point C. Although FIG. 1 illustrates each sub-array 64 of reflectors 30 arranged in a radially outward direction, those skilled in the art will appreciate that this illustration is merely exemplary in nature. For example, in another aspect, the reflectors 30 may be arranged in a rectangular pattern.

The solar cells 22 may also be referred to as photovoltaic cells. The solar cells 22 may be any device configured to convert solar radiation into electrical energy. In one exemplary aspect, the micro-concentrator solar array 10 may include a secondary optical device 62 associated with each solar cell 22. However, it is to be understood that the secondary optical device 62 may be omitted in some aspects. Referring to FIG. 2, the secondary optical device 62 may be positioned along the front surface 60 of the solar cell 22. The secondary optical device 62 may be used to focus the light beams 42 reflected off of each reflection surface 58 of the reflectors 30 and onto a focal point F located on the solar cell 22. Thus, the solar cell 22 may receive an increased amount of light energy if the secondary optical device 62 is included. The secondary optical device 62 may be any type of concentrator or lens for focusing light from the reflectors 30 onto the focal point F of the solar cell 22 such as, for example, a concave lens, a convex lens, a parabolic lens, or a Fresnel lens.

Figure 3:
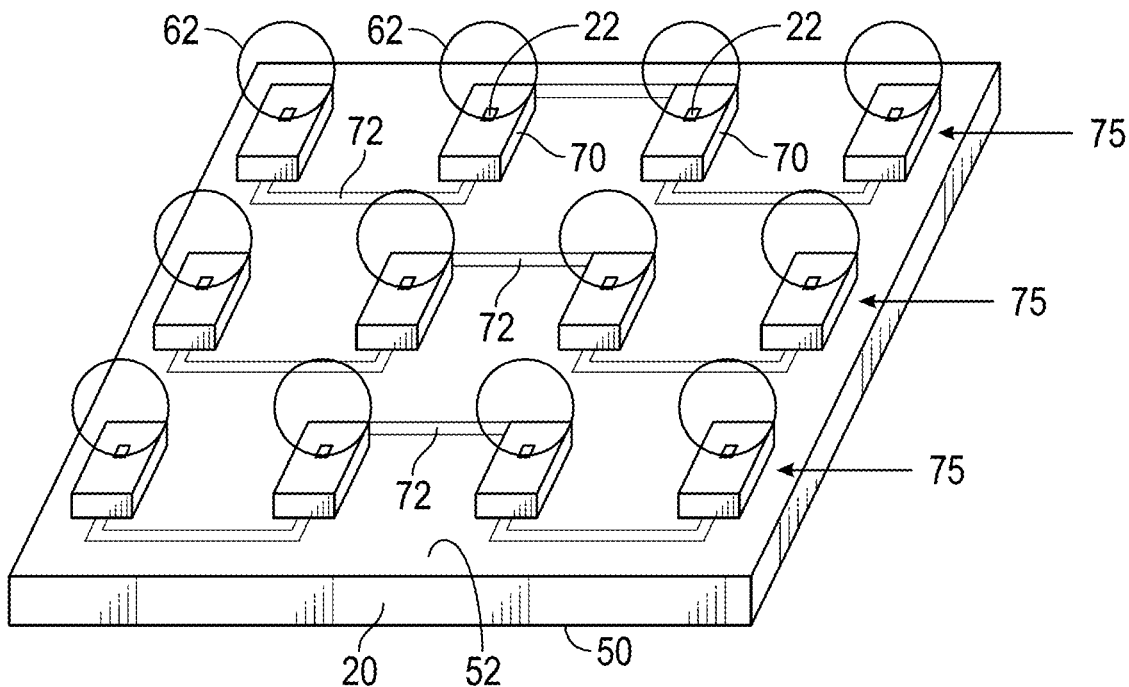
FIG. 3 is a perspective view of a portion of the coverglass shown in FIG. 1, where receivers may be used to mount the solar cells to the coverglass.

FIG. 3 illustrates a portion of the inner surface 52 of the coverglass 20, where the coverglass 20 has been rotated one hundred and eighty degrees such that the inner surface 52 of the coverglass 20 is facing upwardly. In the aspect as shown in FIG. 3, the solar cells 22 are each mounted to and electrically connected to a corresponding receiver 70. Each receiver 70 may be mounted to the inner surface 52 of the coverglass 20. The receivers 70 may be used as an alternative approach for mounting the solar cells 22 to the coverglass 20. In one aspect, the receivers 70 may include a heat sink or other device (not illustrated) for dissipating heat generated by the solar cell 22.

A plurality of interconnects 72 may be used to electrically connect two or more of the receivers 70 to one another. In one aspect, the interconnects 72 may be constructed from an electrically conductive material such as, for example, metal. The interconnects 72 may be located along the inner surface 52 of the coverglass 20, and may be used to electrically connect the receivers 70 in any number of configurations in order to provide the voltage and current required for a specific application. For example, in the aspect as shown in FIG. 3, the interconnects 72 may be used to connect the receivers 70 located in a single row 75 to one another in a series configuration. However, the interconnects 72 may also be used to connect each row 75 of receivers 70 to one another in a parallel configuration (the parallel connection is not illustrated in FIG. 3). Although FIG. 3 illustrates the receivers 70 located in each row 75 connected to one another in a series configuration, it is to be understood that the receivers 70 may be connected to one another in a parallel configuration as well. Moreover, although each row 75 of receivers 70 are described as being connected to one another in a parallel configuration, it is to be understood that the rows 75 of receivers 70 may be connected together in a series configuration as well.

Referring to FIG. 2, the reflectors 30 may be any type of MEMS-based device having an elliptical, cylindrical, rectangular, square, or randomly shaped micro-mirror or micro-reflector configured to reflect light. An actuation device (not illustrated) may be provided for each reflector 30. The actuation device may be used to adjust an amount of tilt of an associated reflector 30. Specifically, as seen in FIG. 2, the amount of tilt of each reflector may be measured by an angle $\alpha$. The angle $\alpha$ may be measured between the reflection surface 58 of the reflector 30 and an axis A-A. The axis A-A may be oriented generally parallel with respect to the substrate 24. A reflected light beam 80 may represent the light reflected off of the reflection surface 58 of the reflector 30 and directed towards the secondary optical device 62. If the secondary optical device 62 is omitted, then the reflected light beam 80 may be directed towards the focal point F located on the solar cell 22. It should be noted that while the reflector 30 is described as being tiltable or rotatable in the x-axis direction (the x-axis is illustrated in FIG. 1), the reflector 30 may be tilted about a second axis of rotation as well. Specifically, in one aspect, the angle $\alpha$ of the reflector 30 may be tilted in the z-axis direction (the z-axis is illustrated in FIG. 1) as well. Thus, the reflector 30 may be tilted using either single-axis tracking (i.e., adjusted in either the x-axis or the z-axis) or dual-axis tracking (i.e., adjusted in both the x-axis and the z-axis). In other words, the reflectors may be tiltable or rotatable about either one axis of rotation or two axes of rotation.

The actuation device (not illustrated) may be any type of device capable of adjusting the angle α of the associated reflector 30. For example, in one non-limiting aspect, the actuating devices may be comb-drive actuators that use static electromagnetic potential for actuation. In another aspect, the actuating devices may be a rotational actuator. One commercially available example of the rotational actuator is the 4-quadrant 2-axis actuators manufactured by Mirrorcle Technologies of Richmond, Calif.

Referring to both FIGS. 1-2, the angle α of the reflectors 30 may be adjusted by applying a specific or unique amount of voltage to each of the actuation devices (not illustrated). For example, with reference to FIG. 2, the reflector R1 located to the far right may be tilted at a different angle α when compared to the angles α of the remaining reflectors R2, R3 and R4 located within the sub-array 64. Each reflector 30 may be tilted at a different angle α based on the reflector's 30 position relative to the focal point F of the corresponding solar cell 22. Thus, a unique amount of voltage may be applied to the actuation device associated with each reflector 30 in order to tilt each reflector 30 by a specific amount.

In one approach, the control module 32 may have a voltage-tilt curve stored in memory. In one aspect, the voltage-tilt curve may be stored in memory as either a lookup table or a polynomial fit to voltage-tilt data. The voltage-tilt curve may include a plurality of unique voltage values that are each associated with different values of the angle α of the reflector 30. It should be noted that the voltage-tilt curve may be common to all of the reflectors 30 located within the micro-concentrator solar array 10. The memory of the control module 32 may also store the position of all of the reflectors 30 relative to the corresponding solar cell 22 as well.

The control module 32 may determine the unique amount of voltage applied to each reflector 30 using the using the following approach. First, the control module 32 may calculate the α of the reflectors 30. In the example as described, the control module 32 calculates the angle α of the reflector R1 to the far right as shown in FIG. 2. The control module 32 may calculate the angle α of the reflector R1 based on the position of the reflector R1 relative to the corresponding solar cell 22 (stored in memory of the control module 32), and an angle θ of the light beams 42. The angle θ of the light beams 42 may be measured with respect to the coverglass 20. The angle θ of the light beams 42 may be a known value stored in memory of the control module 32. The value of the angle θ of the light beams 42 stored in memory may be updated as the position of a light source (e.g., the sun) changes. Once the control module 32 calculates the angle α of the reflector R1, the control module 32 may then obtain the unique amount of voltage applied to the reflector R1 using the voltage tilt-curve. For example, if the control module 32 determines that the angle α of the reflector R1 should be fifteen degrees, then the control module 32 obtains the unique amount of voltage associated with an angle of fifteen degrees from the voltage-tilt curve stored in memory of the control module 32. Finally, the control module 32 may apply the unique amount of voltage obtained from the voltage-tilt curve to the actuation device associated with the reflector R1.

Referring to FIGS. 1-3, the control module 32 may refer to, or be part of, an application specific integrated circuit (ASIC), an electronic circuit, a combinational logic circuit, a field programmable gate array (FPGA), a processor (shared, dedicated, or group) that executes code, or a combination of some or all of the above, such as in a system-on-chip. The control module 32 may be in operative communication with each of the solar cells 22 and the reflectors 30. Specifically, the control module 32 may be in communication with all of the solar cells 22 located within the micro-concentrator solar array 10 through the interconnects 72 located along the coverglass 20 shown in FIG. 3 (the connection between the interconnects 72 and the control module 32 is not illustrated in the figures).

The control module 32 may include control logic for monitoring the electrical output generated by all of the solar cells 22 located within the micro-concentrator solar array 10. The electrical output measured by the control module 32 may be, for example, voltage, current, or power generated by the solar cells 22. The control module 32 may monitor the electrical output generated by all of the solar cells 22 located within the micro-concentrator solar array 10 at a predetermined time interval. The predetermined time interval may be any set amount of time such as, for example, every thirty seconds, every minute, or every five minutes.

In the illustration as shown in FIG. 2, the reflectors 30 are tilted at their ideal angles α such that the reflected light beams 80 are each directed towards the focal point F located on the solar cell 22. The control module 32 may store an ideal output value within memory. The ideal output value represents the electrical output of the solar cells 22 (e.g., voltage, current, power, etc.) when the reflectors 30 are tilted at their ideal angles. FIG. 2 illustrates the light source (e.g., the sun) directing the light beams 42 in a direction generally perpendicular to the coverglass 20 and the substrate 24. However, as the sun moves throughout the sky throughout the day, the direction of the light beams 42 change accordingly. Thus, the position of the light beams 80 reflected off of the reflection surface 58 of each reflector 30 may also change. As a result, the reflected light beams 80 are eventually reflected away from the focal point F of the corresponding solar cell 22. Focusing light upon the focal point F of a corresponding solar cell 22 may maximize the amount of electrical output generated by the solar cell 22. As the reflected light beams 80 are directed away from the focal point F of the corresponding solar cell 22, less light energy may be received by the solar cell 22. As a result, the electrical output generated by the solar cell 22 is decreased.

Referring to FIGS. 1-2, the control module 32 monitors the electrical output generated by all of the solar cells 22 located within the micro-concentrator solar array 10 at the predetermined time interval. The control module 32 also includes control logic for comparing the electrical output generated by the solar cells 22 with a threshold value. The threshold value may represent an electrical output generated by all of the solar cells 22 that is less than the ideal output value. For example, in one non-limiting aspect, the threshold value may be about ninety-five percent of the ideal output value.

The control module 32 may include circuitry or control logic for applying the unique amount of voltage to each of the actuation devices (not illustrated) associated with the reflectors 30 if the electrical output generated by all of the solar cells 22 is below the threshold value. Specifically, once the electrical output generated by the solar cells 22 drops below a threshold value, then the control module 32 may apply the unique amount of voltage to each of the actuation devices (not illustrated). The reflectors 30 may be re-positioned such that the light beams 80 reflected off of the reflection surface 58 of each reflector 30 may be directed back towards the focal point F of the corresponding solar cell 22. In one aspect, the control module 32 may include control logic for re-positioning the reflectors 30 towards the focal point F of the corresponding solar cell 22 by first stepping through a plurality of pre-programmed reflector positions stored in memory. Each pre-programmed reflector position corresponds with a specific position of the light source. For example, if the light source is the sun, then each pre-programmed reflector position stored in memory of the control module 32 may correspond with the different positions of the sun in the sky. The control module 32 may step though the pre-programmed reflector positions until the reflectors 30 align and focus the light beams 80 towards the focal point F of the solar cell 22.

Figure 4:
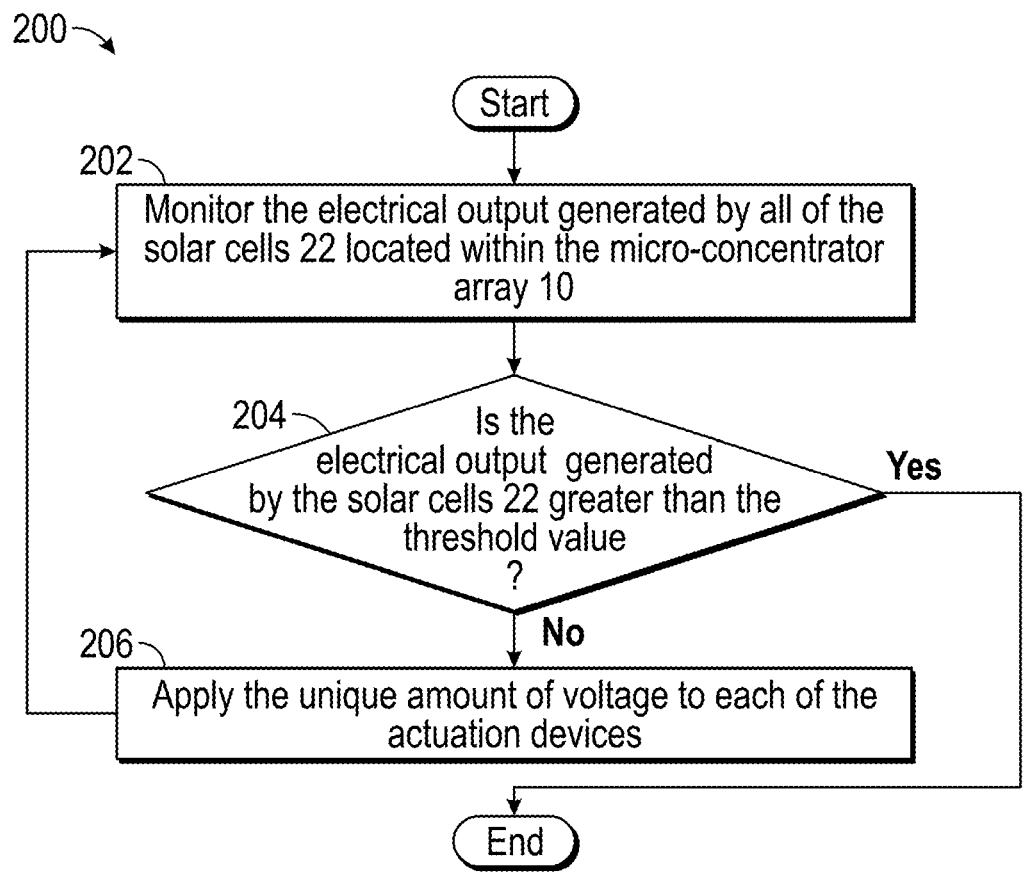
FIG. 4 is an exemplary process flow diagram illustrating a method of adjusting the reflectors shown in FIG. 1.

FIG. 4 is a process flow diagram illustrating an exemplary method 200 of adjusting the tilt of the reflectors 30. Referring generally to FIGS. 1-4, method 200 may begin at block 202, where the control module 32 monitors the electrical output generated by all of the solar cells 22 located within the micro-concentrator solar array 10. The electrical output measured by the control module 32 may be, for example, voltage, current, or power generated by the solar cells 22. Method 200 may then proceed to block 204.

In block 204, the control module 32 compares the electrical output generated by all of the solar cells 22 located within the micro-concentrator solar array 10 with the threshold value. If the electrical output is equal to or greater than the threshold value, then method 200 may then terminate. However, if the electrical output is less than the threshold value, then method 200 may proceed to block 206.

In block 206, the control module 32 may apply the unique amount of voltage to each of the actuation devices (not illustrated). As discussed above, applying the unique amount of voltage to each of the actuation devices may re-position each of the reflectors 30 such that the light beams 80 reflected off of the reflection surface 58 of each reflector 30 may be directed back towards the focal point F of the corresponding solar cell 22. Method 200 may then return to block 202.

Figure 5:
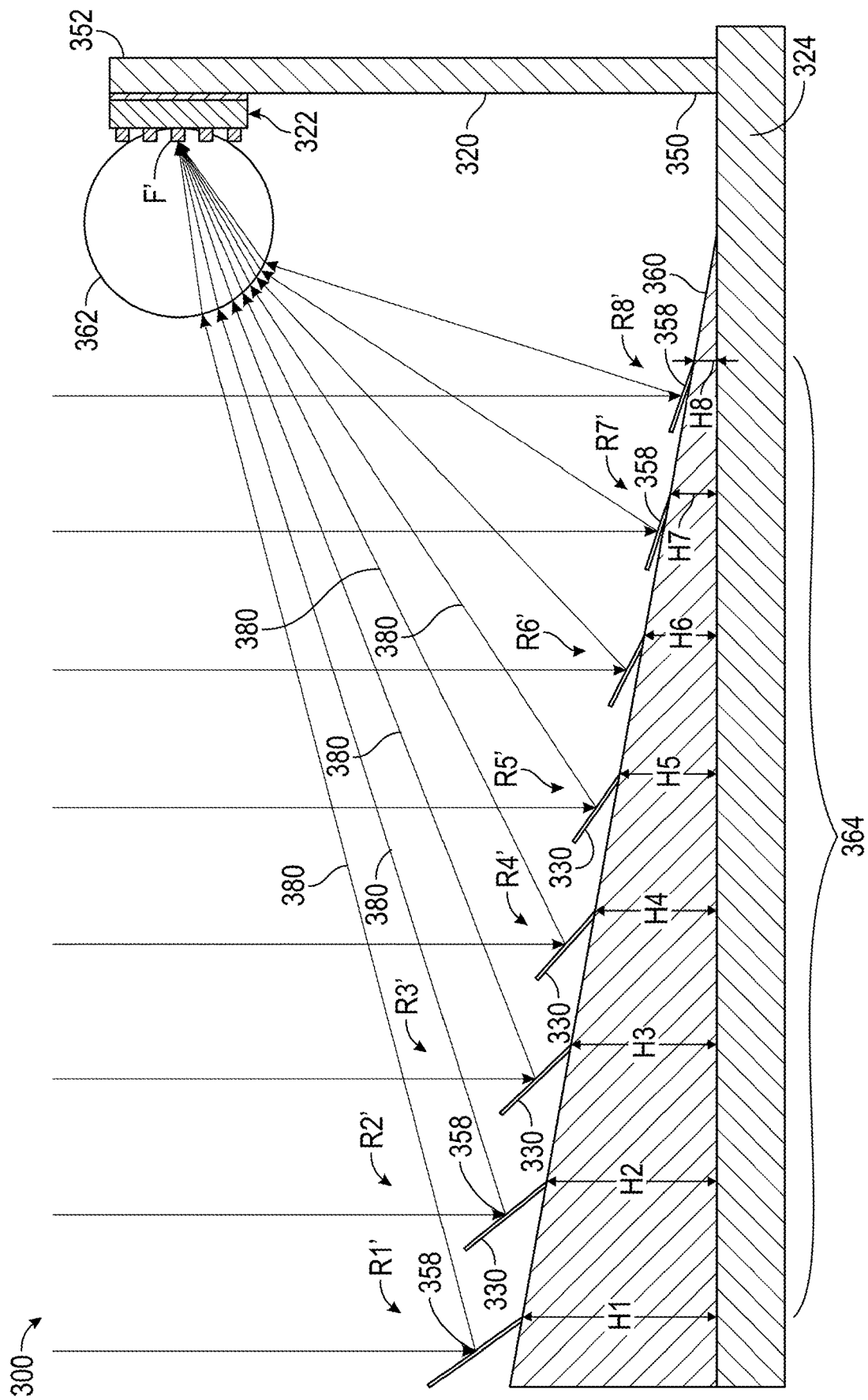
FIG. 5 is an illustration of an alternative aspect of the micro-concentrator solar array.

FIG. 5 is a cross-section of an alternative aspect of a micro-concentrator solar array 300, illustrating a single solar cell 322 and a sub-array 364 of reflectors 330 associated with the solar cell 322. In the aspect as shown in FIG. 5, the reflectors 330 may be supported by a substrate 324. A corresponding support member 320 may be attached or otherwise affixed to the substrate 324. Specifically, the support member 320 includes a first end 350 and a second end 352. The first end 350 of the support member 320 may be affixed to the substrate 324. The solar cell 322 may be affixed to the second end 352 of the support member 320. It should be noted that the aspect as shown in FIG. 5 does not require a coverglass, and instead the support member 320 may be used to carry the solar cell 322. Although FIG. 5 illustrates a single solar cell 322, those skilled in the art will appreciate that the solar cell 322 may be part of an array of multiple solar cells. For example, the substrate 324 may include multiple support members 320. Each support member 320 may carry a solar cell 322. Also, while FIG. 5 illustrates a single sub-array 364 of the reflectors 330, it is to be understood that multiple sub-arrays 364 of reflectors 330 may surround the solar cell 322.

The substrate 324 may include a ramped or inclined inner surface 360. The reflectors 330 may be positioned along the inner surface 360 of the substrate 324. In the non-limiting aspect as shown, the sub-array 364 includes eight reflectors R1'-R8', where the reflector R1' may be the reflector 330 located the furthest away from the solar cell 322, and the reflector R8' may be the reflector 330 located closest to the solar cell 322. The inner surface 360 of the substrate 324 may be angled such that the reflector R1' may be positioned at a vertical height H1, the reflector R2' may be positioned at a vertical height H2, and the remaining reflectors R3'-R8' may be positioned accordingly.

The vertical heights H1-H8 of the reflectors R1'-R8' may be graduated accordingly such that light reflected off of one of the reflectors 330 in the sub-array 364 does not generally interfere with another reflector 330 located downstream. For example, the vertical height H1 of the reflector R1' is greater than the vertical heights of the remaining reflectors R2'-R8'. Thus, the reflector R1' may be elevated such that a beam of light 380 reflected off a reflection surface 358 of the reflector R1' does not interfere or intersect with any of the remaining reflectors R2'-R8' located within the sub-array 364. Instead, the beam of light 380 reflected off the reflection surface 358 may be directed towards a secondary optical device 362 and onto a focal point F' located on the solar cell 322.

Referring generally to FIG. 1-5, the disclosed micro-concentrator solar array 10 provides a relatively compact and efficient approach for converting light into electrical energy. In particular, the disclosed micro-concentrator solar array 10 provides an approach for adjusting the MEMS based reflectors (e.g., the reflectors 30 shown in FIGS. 1-3 or the reflectors 330 shown in FIG. 5) based on the position of a moving light source (not illustrated). For example, if the light source is the sun, the reflectors may track the position of the sun throughout the sky. The reflectors may then reflect the light from the sun onto the focal point of a corresponding solar cell. Therefore, if the micro-concentrator solar array 10 is part of a solar power generator, then a user does not generally need to re-position the solar power generator periodically during the day in order to accommodate the changing position of the sun within the sky. Moreover, many solar power generators currently available employ flat-plate technologies, where the solar cells operate under 1-sun concentration. In contrast, the disclosed micro-concentrator solar array 10 uses the reflectors in order to concentrate light onto the solar cells. In one aspect, the disclosed solar cells may operate between about 5-suns to about 500-suns concentration. Thus, the disclosed micro-concentrator solar array 10 may employ smaller solar cells that require less space. The disclosed micro-concentrator array 10 may also provide higher solar-to-power conversion efficiencies, and transform less of light energy into heat when compared to the technologies currently available.

While the forms of apparatus and methods herein described constitute preferred aspects of this invention, it is to be understood that the invention is not limited to these precise forms of apparatus and methods, and the changes may be made therein without departing from the scope of the invention.

What is claimed is:

1. A micro-concentrator solar array, comprising:
a substrate defining an inner surface and an outer surface, wherein the inner surface of the substrate is inclined with respect to the outer surface of the substrate;
a support member defining a first end and a second end, wherein the first end of the support member is affixed to the inner surface of the substrate;
a solar cell attached to the second end of the support member, wherein the solar cell includes a focal point;

a plurality of micro-electromechanical systems (MEMS) based reflectors arranged upon the substrate, wherein the MEMS based reflectors are each selectively tiltable about at least one axis to reflect a beam of light onto the focal point of the solar cell, and wherein the plurality of MEMS based reflectors are arranged into a plurality of sub-arrays including a subset MEMS based reflectors that are each arranged along the inner surface of the substrate and include graduated heights that result in a first beam of light reflected off of a first MEMS based reflector to not substantially interfere with a second beam of light reflected off of a second MEMS based reflector, the second MEMS based reflector being positioned downstream at a height less than the first MEMS based reflector; and a control module connected to the solar cells and to the MEMS based reflectors, wherein the control module executes instructions to:

monitor an electrical output by the solar cell;

determine that the electrical output by the solar cell is below a threshold value, wherein the threshold value represents the electrical output generated by the solar cell that is less than an ideal output value, and wherein the ideal output value represents the electrical output of the solar cell when the MEMS based reflectors are each tilted to reflect the beam of light back towards the focal point of the solar cell; and in response to determining the determining the electrical output is below the threshold value, re-position each of the MEMS based reflectors about the at least one axis to reflect the beam of light back towards the focal point of the solar cell.

2. The micro-concentrator solar array of claim 1, wherein the first end of the support member and the MEMS based reflectors are both affixed to the inner surface of the substrate.

3. The micro-concentrator solar array of claim 2, wherein the support member projects in an outward direction with respect to the inner surface of the substrate.

4. The micro-concentrator solar array of claim 1, wherein the control module stores in memory a position of all of the MEMS based reflectors.

5. The micro-concentrator solar array of claim 1, wherein the plurality of sub-arrays is arranged upon the inner substrate such that the MEMS based reflectors surround the solar cell.

6. A micro-concentrator solar array, comprising:

a substrate defining an inner surface and an outer surface, wherein the inner surface of the substrate is inclined with respect to the outer surface of the substrate;

a plurality of support members, wherein each of the plurality of support members defines a first end and a second end, and wherein the first end of each support member of the plurality of support members is affixed to the inner surface of the substrate;

a plurality of solar cells, wherein each solar cell of the plurality of solar cells is attached to the second end of a corresponding support member of the plurality of support members, wherein each solar cell of the plurality of solar cells includes a focal point;

a plurality of micro-electromechanical systems (MEMS) based reflectors arranged upon the substrate and grouped into a plurality of sub-arrays having a subset of MEMS based reflectors, wherein each sub-array of the plurality of sub-arrays of the MEMS based reflectors corresponds to one solar cell of the plurality of solar cells, and wherein the MEMS based reflectors of the plurality of sub-arrays are each selectively tiltable about at least one axis to reflect a beam of light onto the focal point of a corresponding solar cell and the subset of MEMS based reflectors include graduated heights that result in a first beam of light reflected off of a first MEMS based reflector to not substantially interfere with a second beam of light reflected off of a second MEMS based reflector, the second MEMS based reflector being positioned downstream at a height less than the first MEMS based reflector; and a control module connected to the plurality of solar cells and to the plurality of MEMS based reflectors, wherein the control module executes instructions to:

monitor an electrical output by the plurality of solar cells;

determine that the electrical output by the plurality of solar cells is below a threshold value, wherein the threshold value represents the electrical output generated by the plurality of solar cells that is less than an ideal output value, and wherein the ideal output value represents the electrical output of the plurality of solar cells when the MEMS based reflectors are each tilted to reflect the beam of light back towards the focal point of a corresponding solar cell; and in response to determining the determining the electrical output is below the threshold value, re-position each of the MEMS based reflectors about the at least one axis to reflect the beam of light back towards the focal point of the corresponding solar cell.

7. The micro-concentrator solar array as recited in claim 6, wherein the first ends of each of the plurality of support members and the plurality of MEMS based reflectors are both affixed to the inner surface of the substrate.

8. The micro-concentrator solar array as recited in claim 7, wherein the support member projects in an outward direction with respect to the inner surface of the substrate.

9. The micro-concentrator solar array of claim 6, wherein the control module stores in memory a position of all of the plurality of MEMS based reflectors.

10. The micro-concentrator solar array of claim 6, wherein the plurality of sub-arrays are each arranged upon the substrate such that the plurality of MEMS based reflectors of a single sub-array surround the corresponding solar cell.

11. A method of tracking light onto a plurality of solar cells of a micro-concentrator solar array, the method comprising:

monitoring an electrical output generated by the plurality of solar cells by a control module, wherein each solar cell of the plurality of solar cells is attached to a corresponding support member and wherein each support member includes a first end attached to an inner surface of the substrate and a second end attached to a corresponding solar cell of the plurality of solar cells, the substrate defining an inner surface and an outer surface, wherein the inner surface of the substrate is inclined with respect to the outer surface of the substrate;

determine that the electrical output by the plurality of solar cells below a threshold value, wherein the threshold value represents the electrical output generated by the plurality of solar cells that is less than an ideal output value;

in response to determining the electrical output generated by the plurality of solar cells is below a threshold value by the control module, re-positioning a plurality of micro-electromechanical systems (MEMS) based reflectors about at least one axis, wherein the MEMS based reflectors are arranged upon the inner surface of the substrate and grouped into a plurality of sub-arrays, wherein each sub-array of the plurality of sub-arrays of the MEMS based corresponds to one of the plurality of solar cells, and wherein the MEMS based reflectors of the plurality of sub-arrays are each selectively tiltable by the control module about at least one axis to reflect a beam of light onto a focal point of a corresponding solar cell, and wherein the ideal output value represents the electrical output of the plurality of solar cells when the MEMS based reflectors are each tilted to reflect the beam of light back towards the focal point of the corresponding solar cell; and reflecting a first beam of light reflected off of a first MEMS based reflector that does not substantially interfere with a second beam of light reflected off of a second MEMS based reflector, the second MEMS based reflector being positioned downstream at a height less than the first MEMS based reflector.

12. The micro-concentrator solar array of claim 1, wherein the control module includes a voltage-tilt curve stored in memory, the voltage-tilt curve having a plurality of unique voltage values that are each associated with different values of an angle of each of the MEMS based reflectors.

13. The micro-concentrator solar array of claim 6, wherein the control module includes a voltage-tilt curve stored in memory, the voltage-tilt curve having a plurality of unique voltage values that are each associated with different values of an angle of each of the MEMS based reflectors.

14. The micro-concentrator solar array of claim 1, wherein the control module calculates an angle of a particular MEMS based reflector based on a position of the particular MEMS based reflector relative to the solar cell and an angle of the beam of light.

15. The micro-concentrator solar array of claim 14, wherein the angle of the beam of light is a known value stored in a memory of the control module.

16. The micro-concentrator solar array of claim 1, wherein the threshold value is about ninety-five percent of the ideal output value.

17. The micro-concentrator solar array of claim 6, wherein the control module calculates an angle of a particular MEMS based reflector based on a position of the particular MEMS based reflector relative to the corresponding solar cell and an angle of the beam of light.

18. The micro-concentrator solar array of claim 17, wherein the angle of the beam of light is a known value stored in a memory of the control module.

19. The micro-concentrator solar array of claim 6, wherein the threshold value is about ninety-five percent of the ideal output value.

20. The method of claim 11, wherein the control module monitors the electrical output generated by the plurality of solar cells at predetermined time intervals.

* * * * *